United States Patent [19]
Etienne et al.

[11] Patent Number: 4,768,071
[45] Date of Patent: Aug. 30, 1988

[54] BALLISTIC TRANSPORT MESFET

[75] Inventors: Patrick Etienne; Trong Linh Nuyen, both of Paris, France

[73] Assignee: Thomson-CSF, Paris, France

[21] Appl. No.: 312,258

[22] Filed: Oct. 13, 1981

[30] Foreign Application Priority Data

Oct. 31, 1980 [FR] France ................. 80 23385

[51] Int. Cl.[4] ............ H01L 29/80; H01L 29/08; H01L 29/56
[52] U.S. Cl. ..................... 357/22; 357/15; 357/56
[58] Field of Search ............. 357/22, 89, 15, 56

[56] References Cited

U.S. PATENT DOCUMENTS

| | | | |
|---|---|---|---|
| 3,660,180 | 5/1972 | Wajda | 148/174 X |
| 3,761,785 | 9/1973 | Pruniaux | 357/22 |
| 4,129,879 | 12/1978 | Tantraporn et al. | 357/22 |
| 4,343,015 | 8/1982 | Baliga et al. | 357/22 X |
| 4,366,493 | 12/1982 | Braslau et al. | 357/22 X |

OTHER PUBLICATIONS

"Growing High Resistivity Films on Low Resistivity Silicon Substrates", Doo et al., IBM Tech. Disclosure Bull., vol. 5, No. 2, Jul. 1982, pp. 50-51.

Primary Examiner—Andrew J. James
Assistant Examiner—John Lamont

[57] ABSTRACT

Field effect transistors are provided and more particularly those which work at very high frequencies.

According to the invention the field effect transistor has a vertical structure, comprising an access electrode, source or drain, on each of the two faces of the substrate wafer. The gate is formed by an N type epitaxial layer thickness sandwiched between two N+ type layers. The gate thickness is then limited by the epitaxial layer thickness which can be obtained of the order of a few hundred angstroms. The gate contact is taken by means of lateral metal layers, on the chamfered sides of the epitaxial layer.

6 Claims, 3 Drawing Sheets

BALLISTIC TRANSPORT MESFET

BACKGROUND OF THE INVENTION

The present invention relates to semi-conductor devices of the field effect transistor type, more especially those whose gates are shorter than the mean free path of the electrons in the semi-conductor material.

Known field effect transistors operate either in a plane structure, the current flowing in the plane of the semi-conductor material wafer, or in a vertical structure, the current flowing perpendicularly to this same plane.

MESFET transistors (Metal Schottky Field Effect Transistors), since they have a so-called planar structure, have on the free face of the wafer the ohmic source and drain contacts and the Schottky gate contact. The MESFETs perform well in the ultra high frequency ranges as well as in logic circuits. However, in order to improve their characteristics at very high frequency or with very low switching time, the length of the gate must be reduced to dimensions of 0.1 micron or less. Such a reduction of the gate length is not easy with "planar" technology, and is limited by masking techniques.

The Gridistor (French Patent No. 1 317 256 of 16th Dec. 1961 and additions thereto) is a junction field effect transistor, with vertical structure having a large number of gate in parallel. It is then a device developing a great deal of power. But its operating frequency is low because of the high parasite capacities and a high gate resistance. Furthermore, because of its structure, the smaller the gate length, the higher this resistance.

It is to palliate the disadvantages met with in common transistors of MESFET and Gridistor type, particularly in the operating frequency, that new field effect transistor structures having very short gate lengths and low gate resistances and source and drain accesses have been perfected.

BRIEF SUMMARY OF THE INVENTION

The field effect transistors of the invention operate in a vertical structure, comparable to that which has just been discussed in connection with the Gridistor.

However, the gate length in the transistors of the invention is much smaller than in the Gridistor, because the invention is rid of the P type gates included between two N type layers by diffusion, i.e. a gate length of the order of the diffusion length.

The gate length in the invention is limited to an epitaxial layer thickness, which can be made very thin, of the order of a few hundred angströms and the gate effect, by pinching an electron depopulated zone, is obtained by means of a metal layer or metalization, situated in the plane of the gate layer but laterally, in electric contact therewith, and which allows the gate control voltage to be applied.

More precisely, the invention relates to a field effect transistor, with ultra short gate, comprising, suported by a heavily doped N+ type substrate, a first N+ type epitaxial layer doped to the level of about $10^{18}$ at. $cm^{-3}$, a second N type epitaxial active layer doped to the level of about $<10^{15}$ at. $cm^{-3}$, and a third N+ type epitaxial layer doped to the level of about $10^{18}$ at. $cm^{-3}$, as well as two electric source and drain contacts, the first deposited on the third layer, the second deposited on the free face of the substrate, and a gate contact, this transistor being characterized in that the thickness of the active layer is less than the mean free path of the electrons in this layer.

DESCRIPTION OF THE PREFERRED EMBODIMENT

Figure 1:
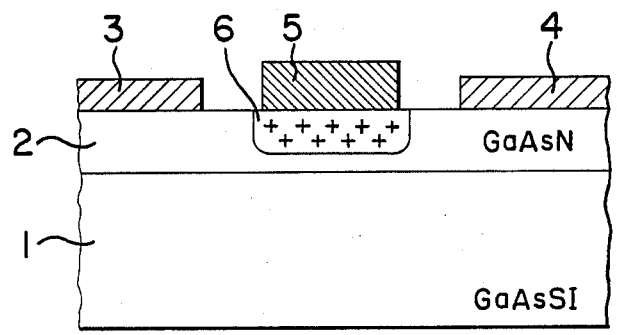
FIG. 1 shows a schematical section of a MESFET in accordance with the known art.

FIG. 1 shows the schematical section of a MESFET transistor of the known art: so as to approximate the field of the invention, that of ultra high frequencies, the material chosen for this example is, among other possible ones, gallium arsenide.

On a semi-insulating GaAs substrate 1 is deposited an N type GaAs layer 2. The ohmic source 3 and drain 4 contacts are deposited by metalization. By means of gate 5, subjected to a control voltage, there develops a space charge region 6 whose thickness depends on the gate voltage. The source-drain current is then modulated by the gate voltage. The structure is said to be planar.

The operating frequency or the switching time of this type of transistor depends on the transit time of the electrons under the gate. Now, this transit time is all the smaller, the shorter the gate. It is then advantageous to reduce the length of the gate. This reduction is all the more advantageous since, for very short gate lengths (a few hundred angströms to a few thousand angstroms, depending on the doping of the material) a physical phenomenon, called ballistic transport, must be taken into account.

The ballistic transport of the electrons may be briefly described as follows: there may be defined, for an electron, moving under an electric field, a mean free path taking into account the collisions of this electron in the crystalline network: collision with the impurities, with the phonons etc. . . . . When the distance travelled by the electron is shorter than the free mean path, the electron reaches a maximum speed, greater than that which it has after collisions, for at each collision it loses energy.

Figure 2:
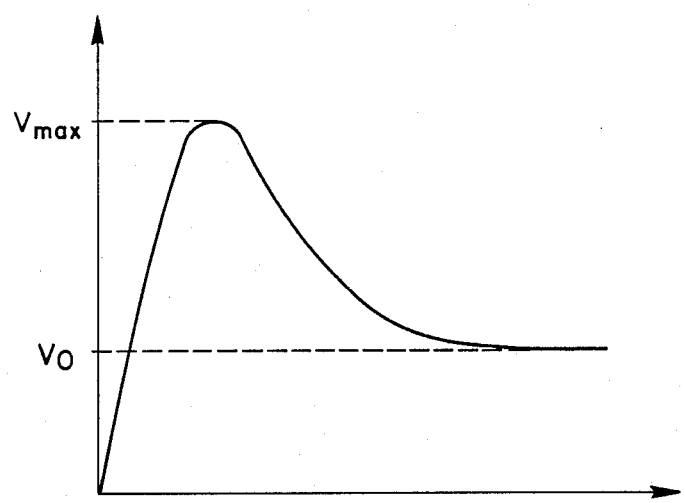
FIG. 2 shows the diagram of variation of the speed of the electrons depending on the distance covered in a semi-conductor material.

FIG. 2 shows this phenomenon in which $v_o$ is the speed in equilibrium operating conditions and $v_{max}$ is the maximum speed reached in ballistic operating conditions. Depending on the electric field applied, speed $v_{max}$ may be three to ten times the speed $v_o$. In other words, when the gate length is sufficiently small for ballistic transport to take place, the transit time of the electrons under the gate is extremely short. The transistor then operates at very high frequency cut-off or, for logic circuits, with very short switching times.

It is therefore useful to reduce the gate of the MESFETs to dimensions of about 0.1 micron, but this requires a fairly clumsy technology and it is difficult to envisage dimensions less than 0.1 micron in the present state of planar technology.

Figure 3:
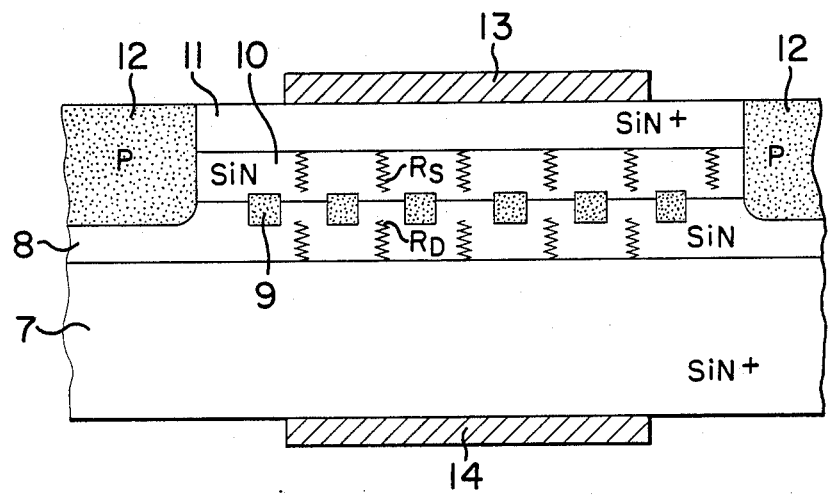
FIG. 3 shows a schematical section of a Gridistor of the known art.

Furthermore, the Gridistor is known, the schematical section of which is shown in FIG. 3.

On a heavily doped N+ type silicon substrate 7 there is deposited an N type Si layer 8. Then, in layer 8, P type gate 9 are implanted or diffused. Then N type layer 10 and N+ type layer 11 are successively deposited. Then the P type caissons 12 are implanted, which go round the transistor so as to connect together gate 9. By means of the metalizations 13 and 14 a current may be passed between source and drain. This current is modulated by the gate voltage. It should be noted that this current is not in the plane of the substrate. The Gridistor is said to be of vertical structure in opposition to the planar structure well-known to those skilled in the art.

Conventionally, the gate length is defined as the distance travelled by the electrons under the gate. In the case of the Gridistor the gate length is then the thickness of the implanted or diffused zone 8. Furthermore, the structure of the Gridistor allows several gates to be placed in parallel, which is favourable to the construction of a power device. But several factors cause a limitation in the operating frequency thereof: the gate, of type P, has a high resistance, the parasite capacities created by caissons 12 and the soldering studs of the gate are very high and finally it is difficult to have a gate length reaching a few thousand angstroms; which is insufficient for benefiting from the ballistic transport phenomenon. Furthermore, a reduction in gate length would cause considerable increase in its resistance. Finally, since the thickness of layers 8 and 10 is greater than the gate length, high parasite access resistances $R_S$ and $R_D$ are created therein.

The transistors of the invention have a vertical structure like the Gridistor but present important progress in so far as the operating frequencies are concerned and a simplification for industrial production.

Firstly, the thickness of the active layer is small, of the order of a few hundred angströms, so as to be the seat of the ballistic transport of electrons.

Secondly, the active layer is included between two heavily doped layers, themselves small in thickness so as to minimize the access resistances $R_S$ and $R_D$.

Thirdly, the active layer is weakly doped, but since this layer is very thin and is included between heavily doped layers, the electron concentration in the active layer is high, higher than the impurity concentration.

Figure 4:
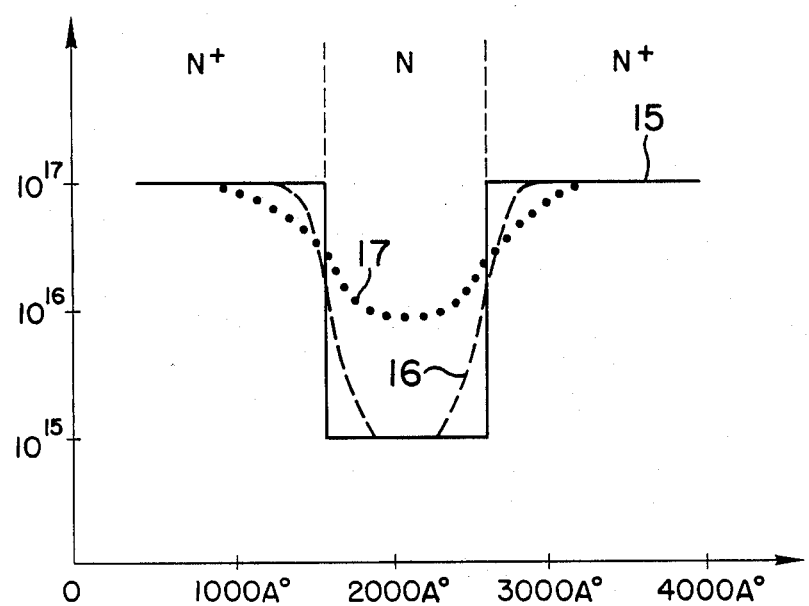
FIG. 4 shows the distribution of the electron concentration in a multi-layer structure where the weakly doped central layer is sandwiched between two heavily doped layers.

This property is described in FIG. 4: line 15 (continuous line) shows the doping levels theoretically desired in the N+N N+ structure, line 16 (broken line) shows the actual profile of the impurities taking into account the diffusion of these impurities between layers and line 17 (dotted line) shows the actual profile of the free electrons. The free electron concentration in the weakly doped N region is higher than that of the doping impurities; the N region gains electrons at the expense of the N+ regions. Such an N+N N+ structure presents, with respect to a structure in which the active N layer is intentionally doped to a level, for example, of $10^{17}$ at. cm$^{-3}$, not only the advantage of being the seat of the ballistic transport but of facilitating the construction of the transistor.

Figure 5:
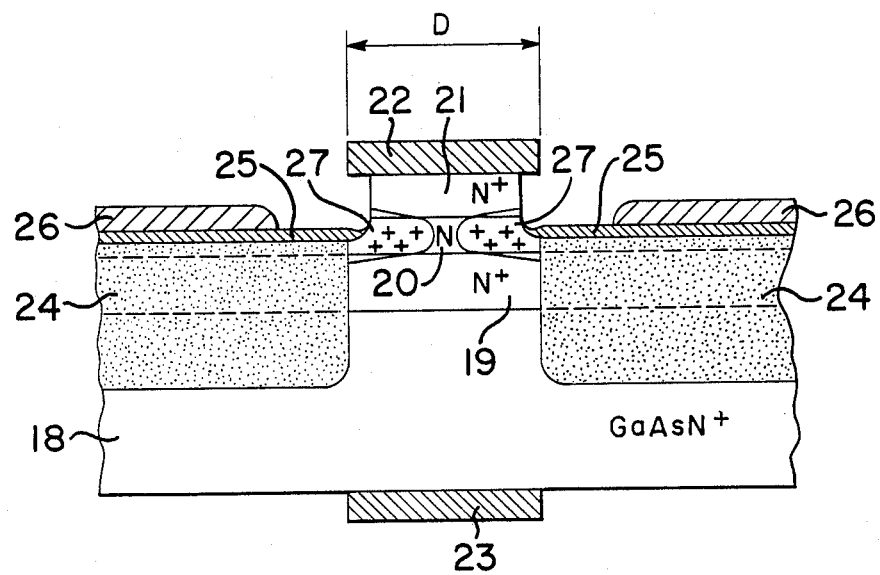
FIG. 5 shows in schematical section an example of the ultra-short gate transistor of the invention.

FIG. 5 shows, in schematical section, an example of a transistor in accordance with the invention.

On a heavily doped N+ type GaAs substrate 18 are deposited successively by epitaxy a first N+ type layer 19 doped to some $10^{18}$ at. cm$^{-3}$ of a thickness of 1000 to several thousand angströms, a second N type layer 20 with an impurity concentration of about $10^{15}$ at. cm$^{-3}$ and of a thickness of several hundred angstroms, and a third N+ type layer 21 doped to some $10^{18}$ at. cm$^{-3}$ of a thickness of about 1000 angstroms. A metal layer 22 is deposited on layer 21 to form a first ohmic contact, source or drain, a second contact 23, drain or source, is deposited on the other face of substrate 18.

By means of a lithographic operation, known in the art, there is defined on contact 22 a stud having a lateral dimension D equivalent to about twice the depth of the electron depopulated zones 27. For a $10^{15}$ at. cm$^{-3}$ dopage, the depth of the depopulated zones 27 is about 1 micron. A dimension of two microns is very easily obtainable by conventional lithographic operations.

By means of ionic etching, the layer 21 is then removed except in the parts situated below contact 22. Then the whole is etched with a chemical solution so that layer 21 is set back with respect to contact 22, and so that layer 20 is partially etched over about half its thickness. A crystallographic orientation may be chosen such that this chemcial etching creates a sloping plane on layer 20. The two caissons 24 of high resistivity are obtained by bombardment with charged particles, such as for example protons, the central part being protected from the protons by metal layer 22. Then the two gate metal layers 25 are deposited by evaporation. This evaporation may be inclined with respect to the normal to the plane of the substrate so that metal layers 25 cover the side of layer 20. The thickness of the metal layers must be smaller than that of layer 20. So as to reduce the gate resistance, an extra thickness of metal 26 is deposited on the gates.

The modulation of the source-drain current is obtained by biassing gates 25, which causes the depth of the space charge zones 27 to vary. Because the thickness of layers 20 and 25 are very small (a few hundred angstroms) the distance travelled by the electrons under the gates is very small and the ballistic transport operating conditions are obtained. These operating conditions are all the more easy to obtain, the lower the impurity concentration in active layer 20. Moreover, the parasite capacities are greatly reduced because of caissons 24.

Figure 6:
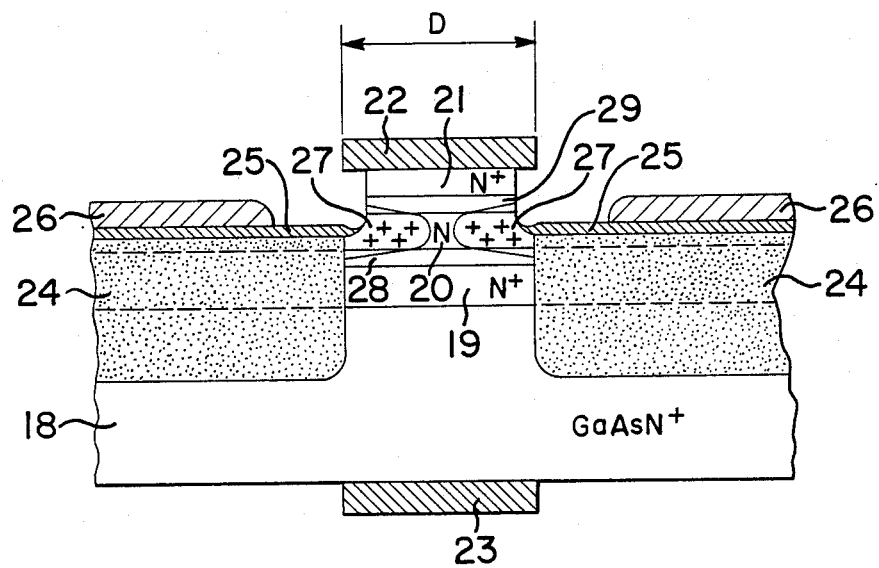
FIG. 6 shows another example of a gate transistor of the invention.

So as to better control the impurity profiles in the N+N N+ structure, there may be sandwiched between layers 19 and 20 and layers 20 and 21 a thin layer 28, 29 respectively, of a thickness of the order of a few angströms and with doping of the order of $10^{17}$ at. cm$^{-3}$, as shown in FIG. 6.

This type of transistor more particularly constructed with GaAs type and family III-V materials, finds applications in the ultra-high frequency range, particularly for telecommunications.

What is claimed is:

1. In a field effect transistor with ultrashort gate, comprising, supported by a heavily doped N+ type substrate, a first N+ type epitaxial layer doped to the level of about $10^{18}$ at. cm$^{-3}$, a second N type active epitaxial layer doped to about the level of $\leq 10^{15}$ at. cm$^{-3}$, and a third N+ type epitaxial layer doped to the level of about $10^{18}$ at. cm$^{-3}$, as well as two electric source and drain contacts, the first contact deposited on the third layer, the second contact deposited on the free face of the substrate, and a gate contact, the thickness of the active layer being less than the mean free path of the electrons in said active layer, and the thickness of said gate contact being smaller than that of said active layer.

2. The field effect transistor as claimed in claim 1, wherein said third layer and—partially—said second layer project with respect to the upper face of the substrate and this projecting part frees sides which are set back several hundred angstroms with respect to the metal deposition which covers said third layer.

3. The field effect transistor as claimed in claim 1, wherein a metal layer of great thickness, several thousand angstroms is deposited on said gate contact so as to reduce the electric gate resistance.

4. The field effect transistor as claimed in claim 2, wherein, under studs used for soldering the electric contacts to said metal layer, a semi-insulating region is provided by implantation of charged particles.

5. The field effect transistor as claimed in claim 1, wherein a layer having a thickness of about 1000 Å and N type doping to about the level of $10^{17}$ at. $cm^{-3}$, is sandwiched between said first and said second epitaxial layers.

6. The field effect transistor as claimed in claim 1, wherein a layer having a thickness of about 1000 Å and N type doping to the level of about $10^{17}$ at. $cm^{-3}$, is sandwiched between said second and third epitaxial layers.

* * * * *